US011733749B2

(12) United States Patent
Lin et al.

(10) Patent No.: US 11,733,749 B2
(45) Date of Patent: Aug. 22, 2023

(54) ELECTRONIC DEVICE COMPRISING THERMALLY CONDUCTIVE CONNECTOR

(71) Applicant: QUALCOMM Incorporated, San Diego, CA (US)

(72) Inventors: Hung-Wen Lin, Kaohsiung (TW); Sin-Shong Wang, Taipei (TW); Keith Wang, Taoyuan (TW); Ajit Kumar Vallabhaneni, Carlsbad, CA (US); Jen-Chun Chang, Taipei (TW)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/094,035

(22) Filed: Nov. 10, 2020

(65) Prior Publication Data

US 2021/0373628 A1    Dec. 2, 2021

Related U.S. Application Data

(60) Provisional application No. 63/032,275, filed on May 29, 2020.

(51) Int. Cl.
G06F 1/20 (2006.01)
H05K 7/20 (2006.01)

(52) U.S. Cl.
CPC ............ *G06F 1/206* (2013.01); *H05K 7/2039* (2013.01)

(58) Field of Classification Search
CPC .... G06F 1/1681; G06F 1/1601; G06F 1/1683; G06F 1/206; G06F 1/203; H05K 5/0226; H05K 5/03; H05K 5/0017; H05K 7/20409; H05K 5/0239
See application file for complete search history.

(56) References Cited

U.S. PATENT DOCUMENTS

| | | | | |
|---|---|---|---|---|
| 2005/0103926 A1* | 5/2005 | Hawthorne | ............. | F42B 10/64 244/3.27 |
| 2005/0136248 A1* | 6/2005 | Leu | ......... | C23C 26/00 428/332 |
| 2005/0270746 A1* | 12/2005 | Reis | ......... | G06F 1/203 361/708 |
| 2007/0231560 A1* | 10/2007 | Zhang | .................... | F28F 13/00 428/323 |
| 2009/0127712 A1* | 5/2009 | Wyland | .................. | B82Y 30/00 257/773 |

(Continued)

OTHER PUBLICATIONS

International Search Report and Written Opinion—PCT/US2021/029676—ISA/EPO—dated Jul. 30, 2021.

*Primary Examiner* — Adam B Dravininkas
(74) *Attorney, Agent, or Firm* — Loza & Loza, LLP

(57) ABSTRACT

An electronic device that includes a first device portion, a second device portion coupled to the first device portion, and a uni-directional thermally conductive connector coupled to the first device portion and the second device portion. The first device portion comprises a region that includes a component configured to generate heat. The uni-directional thermally conductive connector is configured to dissipate heat away from the first device portion and towards the second device portion. The uni-directional thermally conductive connector includes a thermally conductive material that primarily dissipates heat along a first direction of the thermally conductive material.

14 Claims, 12 Drawing Sheets

(56) References Cited

U.S. PATENT DOCUMENTS

| | | | |
|---|---|---|---|
| 2014/0217574 A1* | 8/2014 | Kuczynski | H01L 24/83 264/108 |
| 2017/0142861 A1* | 5/2017 | McLaughlin | H05K 7/2039 |
| 2018/0092253 A1 | 3/2018 | Oiu et al. | |
| 2019/0317572 A1* | 10/2019 | North | G06F 1/203 |
| 2020/0166974 A1* | 5/2020 | Ai | H04M 1/0268 |
| 2020/0279989 A1* | 9/2020 | Sperry | H01L 35/32 |

* cited by examiner

TOP FRONT VIEW

BACK SIDE VIEW

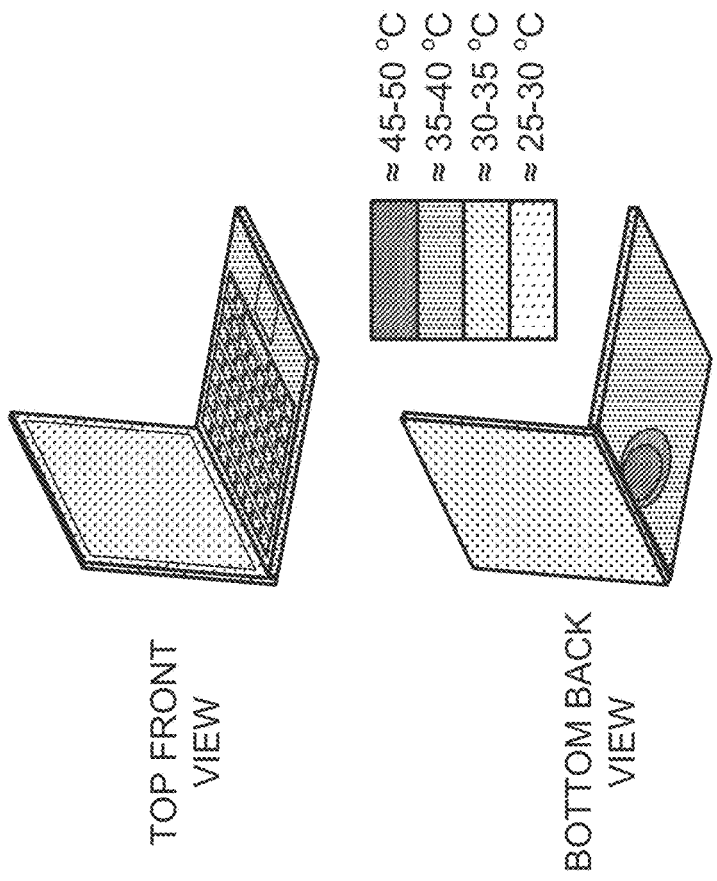
FIG. 10
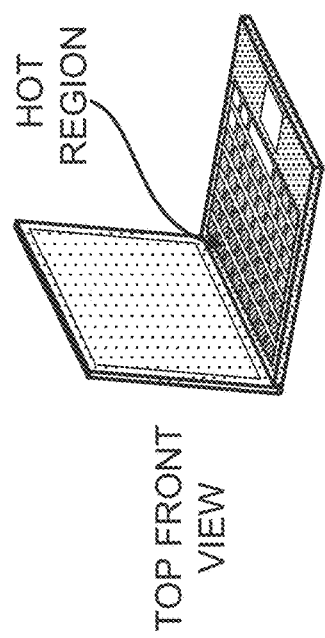
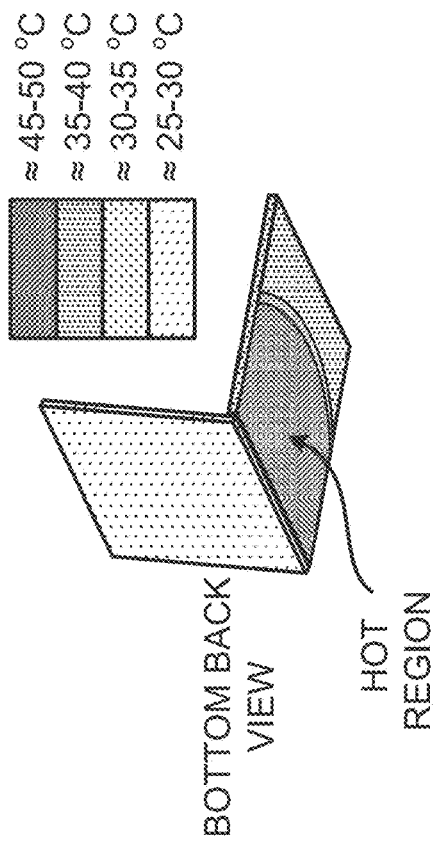
FIG. 9

ELECTRONIC DEVICE COMPRISING THERMALLY CONDUCTIVE CONNECTOR

CROSS-REFERENCE/CLAIM OF PRIORITY TO RELATED APPLICATION

The present application claims priority to and the benefit of U.S. Provisional Application No. 63/032,275, filed on May 29, 2020, and titled, "ELECTRONIC DEVICE COMPRISING THERMALLY CONDUCTIVE CONNECTOR", which is hereby expressly incorporated by reference.

Field

Various features relate to an electronic device that includes a heat dissipating device, but more specifically to an electronic device that includes a thermally conductive connector.

Background

FIG. 1 illustrates a computer device 100 that includes a primary portion 102 and a screen portion 104. The primary portion 102 is portion of the computer device 100 that includes a keyboard, a printed circuit board (PCB) 105, an integrated device 107 and a heat spreader 109. The PCB 105, the integrated device 107 and the heat spreader 109 may be located inside of the primary portion 102. When the integrated device 107 is operating, the integrated device 107 may generate heat that is dissipated through the heat spreader 109 and the PCB 105. The heat that is generated by the integrated device 107 mostly dissipates within the primary portion 102, which can cause one or more surfaces of the primary portion 102 of the computer device 100 to be hot enough that a user of the computer device 100 would feel uncomfortable. Additionally, the configuration shown in FIG. 1 must not be powerful enough to dissipate heat to prevent the integrated device 107 from overheating.

There is an ongoing need to improve the heat dissipating capabilities of a device that includes a component that generates heat.

SUMMARY

Various features relate to an electronic device that includes a heat dissipating device, but more specifically to an electronic device that includes a thermally conductive connector.

One example provides an electronic device that includes a first device portion, a second device portion coupled to the first device portion, and a uni-directional thermally conductive connector coupled to the first device portion and the second device portion. The first device portion comprises a region that includes a component configured to generate heat.

Another example provides an electronic device that includes a first device portion, a second device portion coupled to the first device portion, and means for uni-directional thermal conduction coupled to the first device portion and the second device portion. The first device portion comprises a region that includes a component configured to generate heat.

Another example provides an electronic device that includes a first device portion, a second device portion coupled to the first device portion, and a thermally conductive connector coupled to the first device portion and the second device portion. The thermally conductive connector includes an anisotropic thermally conductive material. The first device portion comprises a region that includes a component configured to generate heat.

BRIEF DESCRIPTION OF THE DRAWINGS

Various features, nature and advantages may become apparent from the detailed description set forth below when taken in conjunction with the drawings in which like reference characters identify correspondingly throughout.

FIG. 9 illustrates an exemplary heat map for a computer device without a heat dissipating cable.

FIG. 10 illustrates an exemplary heat map for a computer device that includes a uni-directional thermally conductive connector.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an electronic device that includes a first device portion, a second device portion coupled to the first device portion, and a uni-directional thermally conductive connector coupled to the first device portion and the second device portion. The first device portion comprises a region that includes a component configured to generate heat. The unit-directional thermally conductive connector includes a flexible portion. The uni-directional thermally conductive connector is configured to dissipate heat away from the first device portion and towards the second device portion. The uni-directional thermally conductive connector includes a thermally conductive material that primarily dissipates heat along a first direction of the thermally conductive material. The use of the uni-directional thermally conductive connector enables a more efficient heat dissipation from one region to another without the need of having a separate insulator around the thermally conductive connector, which can reduce the overall thickness of the connector while still providing effective heat dissipation and heat distribution.

Figure 1:
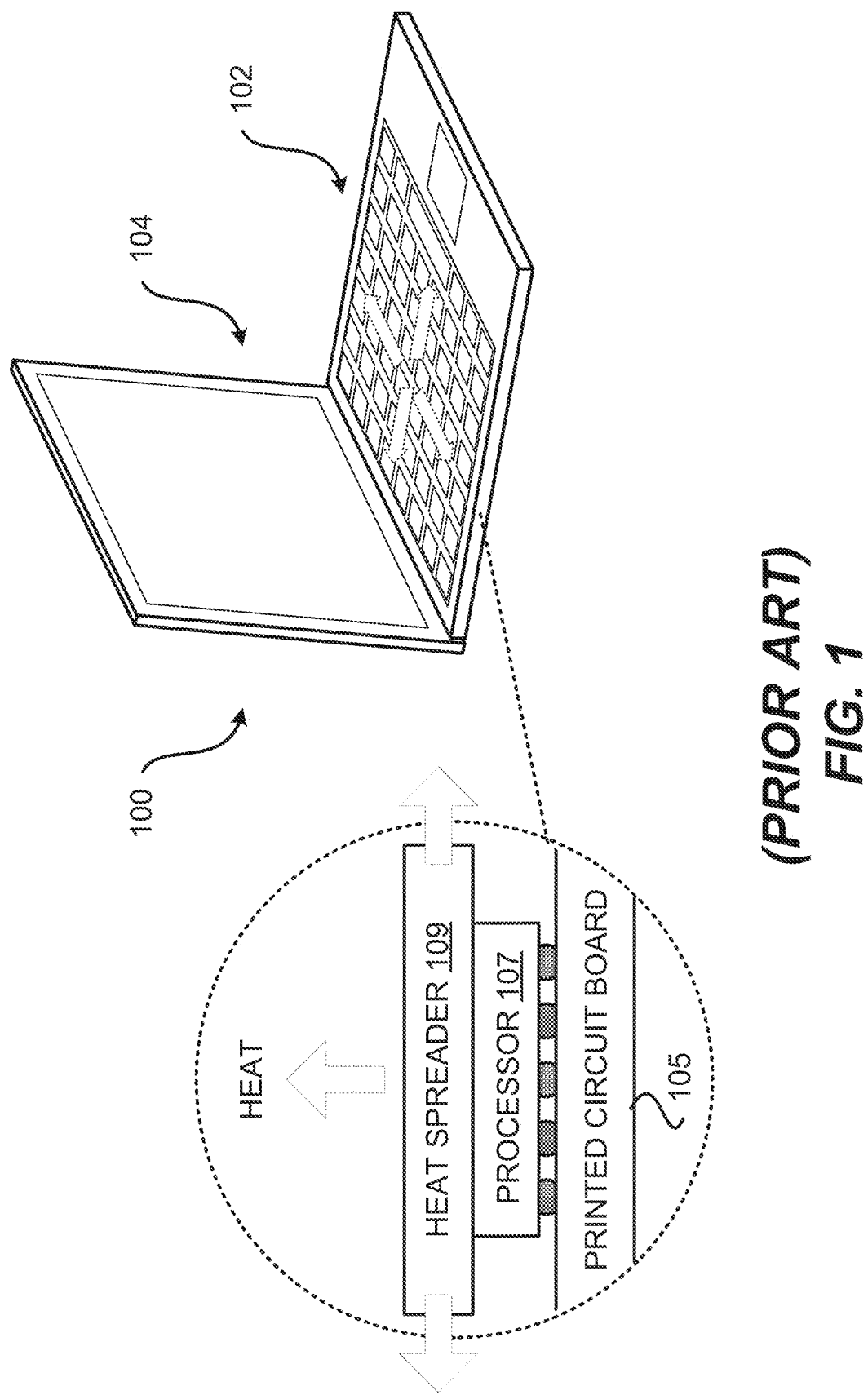
FIG. 1 illustrates a view of a computer device that includes heat spreader.
Figure 2:
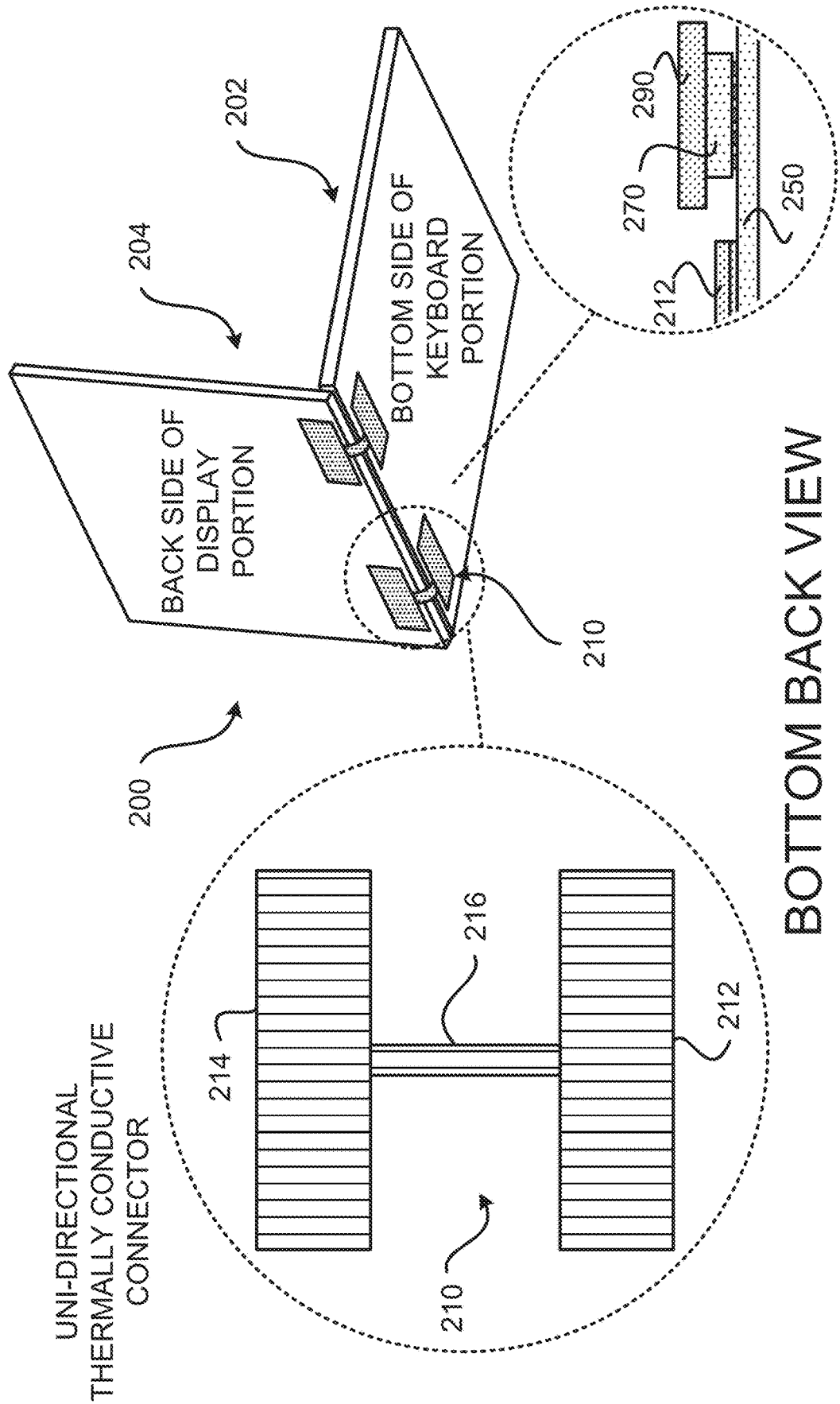
FIG. 2 illustrates a view of a computer device configured to include a uni-directional thermally conductive connector.
Figure 3:
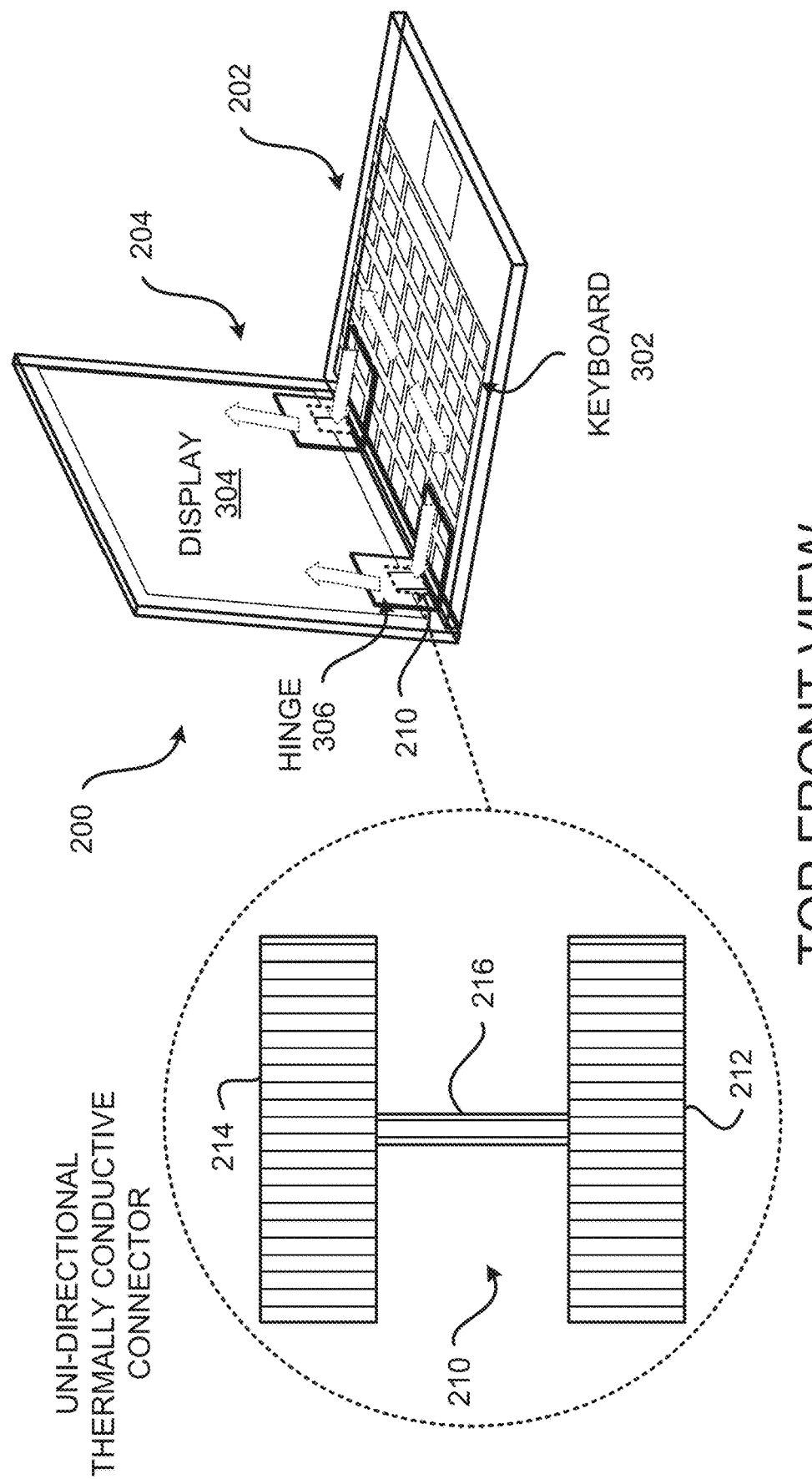
FIG. 3 illustrates a view of a computer device configured to include a uni-directional thermally conductive connector.

Exemplary Electronic Device Comprising a Uni-Directional Thermally Conductive Connector FIGS. 2 and 3 illustrate an electronic device 200 that includes a thermally conductive connector. FIG. 2 illustrates a bottom back view of the electronic device 200. FIG. 3 illustrates a top front view of the electronic device 200. The electronic device 200 includes a first device portion 202, a second device portion 204 and a connector 210. The connector 210 is a uni-directional thermally conductive connector. The uni-directional thermally conductive connector 210 is coupled to the first device portion 202 and the second device portion 204. The uni-directional thermally conductive connector 210 is configured to dissipate heat away from the first device portion 202 and towards the second device portion 204. As will be further described below, the uni-directional thermally conductive connector 210 may include an anisotropic thermally conductive material.

The first device portion 202 may be the main body of the electronic device 200. The first device portion 202 may include several components, including a main body cover, a main body frame, a keyboard 302, a pad, a battery, at least one integrated device (e.g., processor, memory, modem), a package (e.g., radio frequency front end package) and/or a printed circuit board. The second device portion 204 may be configured to provide a display for the electronic device 200. The second device portion 204 may include a display body cover, a display body frame and a display 304. However, it is noted that the first device portion 202 and the second device portion 204 may be configured to include different components and/or other components.

The uni-directional thermally conductive connector 210 includes a first conducting portion 212, a second conducting portion 214 and a third conducting portion 216. The first conducting portion 212, the second conducting portion 214 and the third conducting portion 216 may be contiguous portions. The third conducting portion 216 may be folded, compressed and/or bent. The third conducting portion 216 may be twisted and/or braided in a rope like fashion. The third conducting portion 216 may be wrapped or surrounded by a tape and/or other similar material. The third conducting portion 216 may be configured as a flexible cable. As will be further describes below in at least FIGS. 7 and 8, the uni-directional thermally conductive connector 210 includes a thermally conductive material that primarily dissipates heat along a first direction (e.g., axial direction) of the thermally conductive material. For example, the uni-directional thermally conductive connector 210 may include an anisotropic thermally conductive material. The thermally conductive material may include carbon fiber. The thermally conductive material may have a thermal conductivity value in a first direction (e.g., axial direction) that is in a range of approximately 200-1900 Watts per meter kelvin (W/(mk)). The uni-directional thermally conductive connector 210 may be a means for uni-directional thermal conduction. It is noted that heat traveling through a length of the uni-directional thermally conductive connector 210 may be defined as heat traveling through a path that includes the first conducting portion 212, the third conducting portion 216 and the second conducting portion 214. In some implementations, a thermally conductive material that primarily dissipates heat (e.g., through conduction) along a first direction (e.g., axial direction) of the thermally conductive material, as described in the disclosure, may be a material that dissipate at least 90% (or more) of the heat (e.g., through conduction) along the first direction (e.g., first plane, axial direction) of the thermally conductive material.

There are several advantages to using the uni-directional thermally conductive connector 210. One, as the heat travels through the uni-directional thermally conductive connector 210, the heat will not substantially leak in other regions of the first device portion 202. The nature of the uni-directional thermally conductive material means that in a certain direction, the uni-directional thermally conductive material has a high thermal conductivity value, while in another direction, the uni-directional thermally conductive material has a low thermal conductivity value (e.g., lower thermal conductivity value relative to the high thermal conductivity value). Thus, for example, along the length of the uni-directional thermally conductive connector 210, the connector 210 is a very efficient conductor of heat, while radially and/or along a width and/or a height, the connector 210 is a poor conductor of heat or behaves more like an insulator). Thus, the uni-directional thermally conductive connector 210 is a more efficient, productive and effective conductor of heat away from the first device portion 202. Two, since the uni-directional thermally conductive connector 210 essentially and primarily conducts heat along the length of the connector 210, there is no need to add a separate insulator or insulation layer around the connector 210, which means that the connector 210 can be smaller and thinner than a thermal conductor that requires an separate insulator or insulation layer (e.g., laminated insulation layer). Thus, the uni-directional thermally conductive connector 210 may be used in devices that are smaller and/or have little space for a thermally conductive connector 210. Properties of the uni-directional thermally conductive connector 210 will be further described below in at least FIGS. 7 and 8.

As mentioned above, the connector 210 is coupled to the first device portion 202 and the second device portion 204. The connector 210 may be located inside and/or outside of the first device portion 202 and the second device portion 204. The connector 210 may be coupled to one or more components of the electronic device 200.

As shown in FIG. 2, the electronic device 200 includes a printed circuit board (PCB) 250, an integrated device 270, and a heat spreader 290. The integrated device 270 may be coupled to the PCB 250 (e.g., through solder interconnects). The heat spreader 290 may be coupled to the integrated device 270. The integrated device 270 may include a radio frequency (RF) device, a passive device, a filter, a surface acoustic wave (SAW) filters, a bulk acoustic wave (BAW) filter, a processor, a memory, and/or combinations thereof. The integrated device 270 is an example of a component that is configured to generate heat (e.g., configured to generate heat when the integrated device is operating and/or active).

The PCB 250, the integrated device 270 and the heat spreader 290 may be located in a region of the first device portion 202 of the electronic device 200. The first conducting portion 212 of the connector 210 is coupled to the PCB 250. The first conducting portion 212 may be coupled to the PCB 250 through an adhesive. In some implementations, at least some of the heat that is generated by the integrated device 270 may travel through the PCB 250, the connector 210 (e.g., the first conducting portion 212, the third conducting portion 216, and the second conducting portion 214), and towards the second device portion 204. As will be further described below in at least FIGS. 4 and 5, the connector 210 may be coupled to other components of the electronic device 200.

As shown in FIG. 3, the first device portion 202 and the second device portion 204 may be coupled together through at least one hinge 306. The at least one hinge 306 is configured to allow the second device portion 204 to rotate relative to the first device portion 202. In some implementations, portions of the connector 210 may extend through the at least one hinge 306, and/or may be coupled to the at least one hinge 306. In some implementations, the connector 210 and the at least one hinge 306 may help dissipate heat away from the first device portion 202 and towards the second device portion 204.

Figure 4:
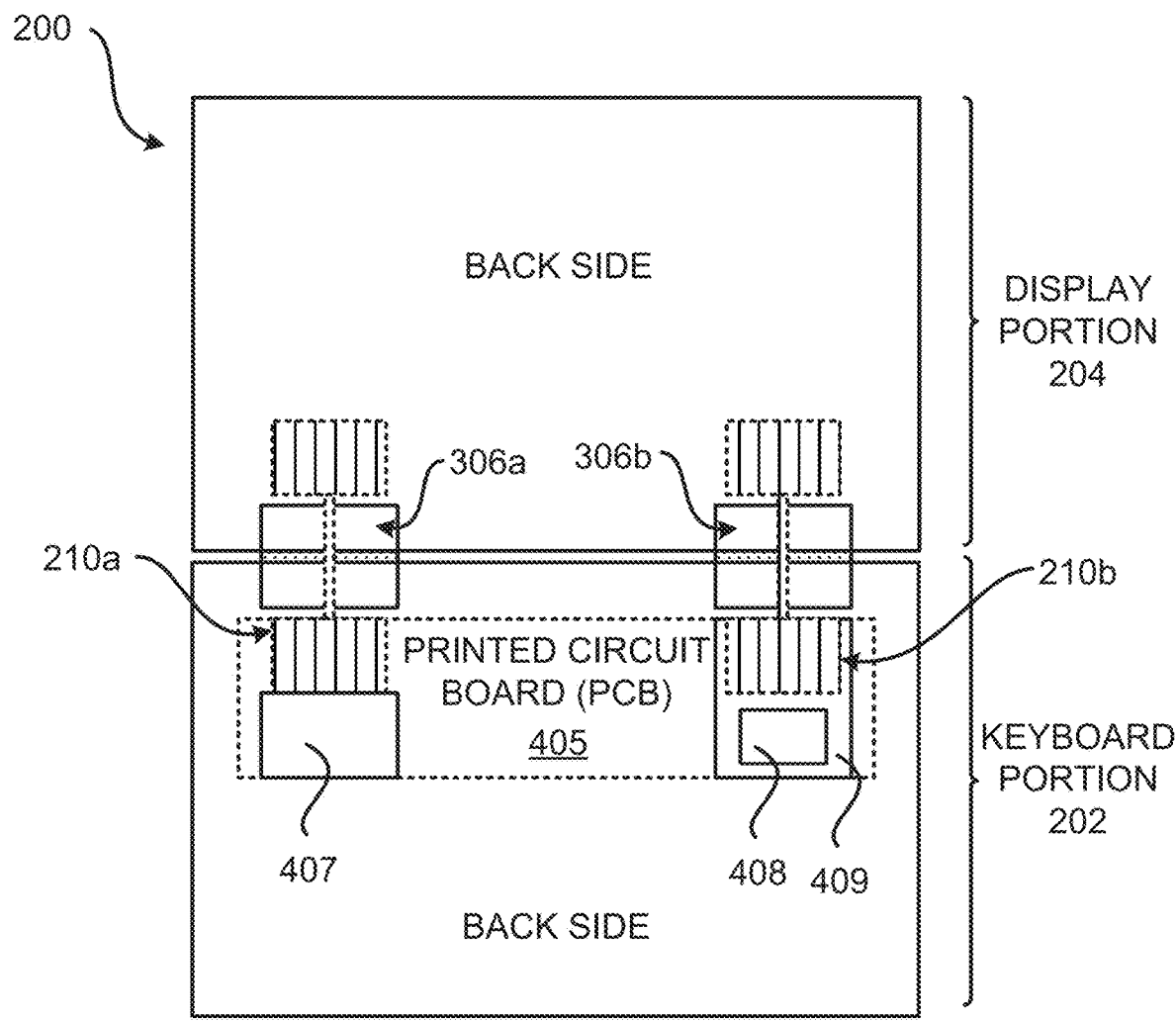
FIG. 4 illustrates a view of a computer device configured to include a uni-directional thermally conductive connector.
Figure 5:
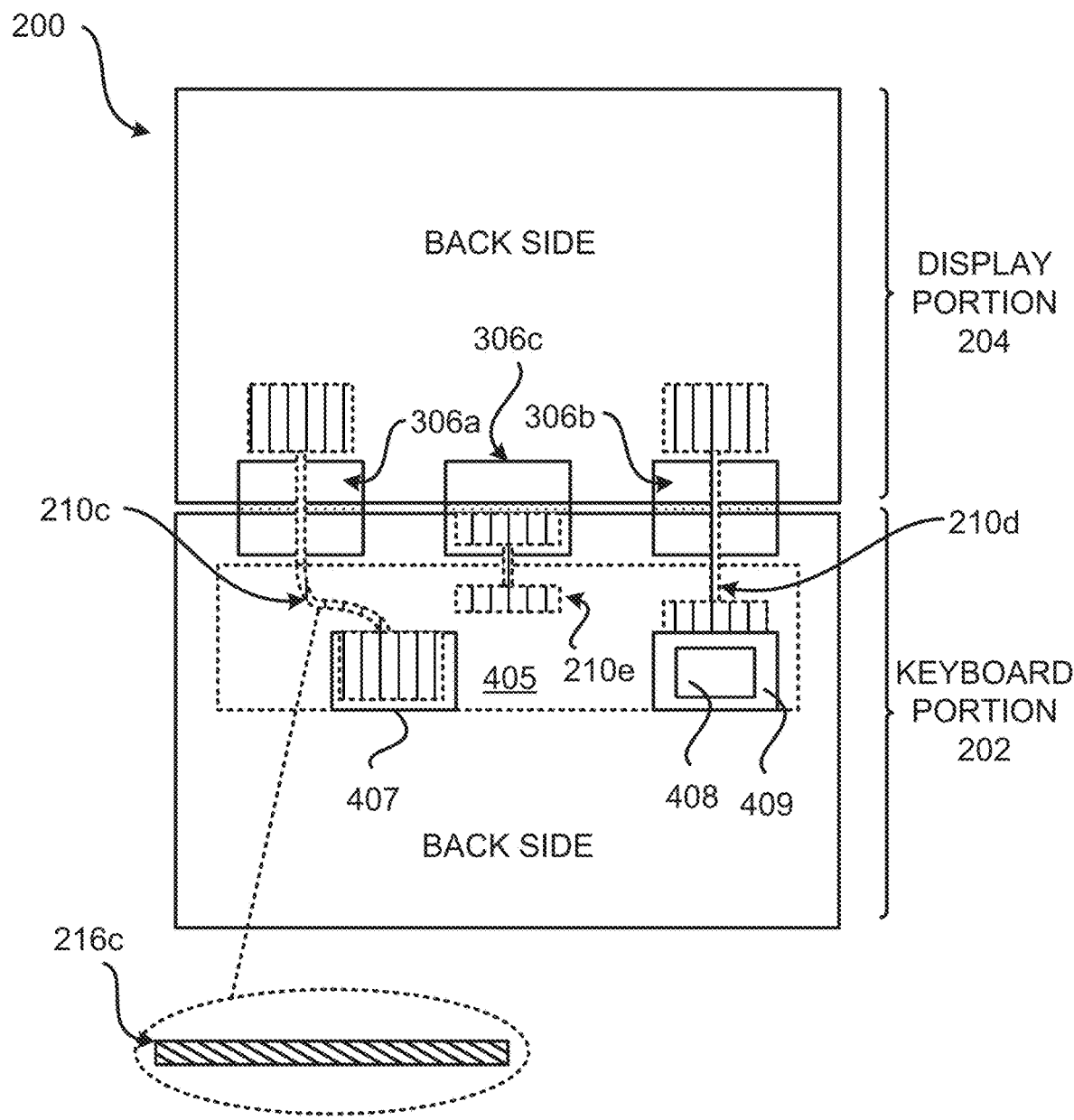
FIG. 5 illustrates a view of a computer device configured to include a uni-directional thermally conductive connector.

As mentioned above, the uni-directional thermally conductive connector 210 may be coupled to various components of the first device portion 202 and the second device portion 204. FIGS. 4 and 5 illustrate examples of the different components that the connector 210 may be coupled to.

FIG. 4 illustrates the electronic device 200 that includes the first device portion 202, the second device portion 204, the hinge 306a and the hinge 306b. The first device portion 202 is coupled to the second device portion 204 through the hinges 306a-306b. The electronic device 200 also includes the uni-directional thermally conductive connector 210a, a uni-directional thermally conductive connector 210b, a PCB 405, an integrated device 407, an integrated device 408, a heat spreader 409, and a display (not visible). The PCB 405, the integrated device 407, the integrated device 408 and the heat spreader 409 are located in the first device portion 202 The display may be located in the second device portion 204 of the electronic device 200.

The connector 210a and the connector 210b are each coupled to the first device portion 202 and the second device portion 204. The connector 210a may extend through the hinge 306a. The connector 210b may extend through the hinge 306b. FIG. 4 illustrates that the connector 210a is coupled to the PCB 405 and a first portion (e.g., component) of the second device portion 204. In some implementations, at least some heat that is generated by the integrated device 407 may extend through the PCB 405, through the connector 210 and to the second device portion 204. The connector 210b is coupled to the heat spreader 409 and a second portion (e.g., component) of the second device portion 204. In some implementations, at least some heat that is generated by the integrated device 408 may extend through the heat spreader 409, the connector 210b and to the second device portion 204.

FIG. 5 illustrates the electronic device 200 that includes a plurality of hinges (306a, 306b, and 306c) and a plurality of uni-directional thermally conductive connectors 210c, 210d and 210e. The first device portion 202 is coupled to the second device portion 204 through the plurality of hinges (306a, 306b, and 306c). The connector 210c, the connector 210d and the connector 210e are each coupled to the first device portion 202 and the second device portion 204. The connector 210c may extend through the hinge 306a. The connector 210d may extend through the hinge 306b.

FIG. 5 illustrates that the connector 210c is coupled to the integrated device 407 and a first portion (e.g., component) of the second device portion 204. In some implementations, at least some heat that is generated by the integrated device 407 may extend through the connector 210 and to the second device portion 204. The connector 210d is coupled to the PCB 405 and a second portion (e.g., component) of the second device portion 204. In some implementations, at least some heat that is generated by the integrated device 408 may extend through the heat spreader 409, and at least some of the heat that is generated by the integrated device 408 may extend through PCB 405, the connector 210d and to the second device portion 204. The connector 210e is coupled to the PCB 405 and the hinge 306c. In some implementations, at least some of the heat that is generated by the integrated device 407 may extend through the PCB 405, through the connector 210e, through the hinge 306c, and to the second device portion 204. Similarly, in some implementations, at least some of the heat that is generated by the integrated device 408 may extend through the PCB 405, through the connector 210e, through the hinge 306c, and to the second device portion 204.

The connectors (e.g., 210, 210a, 210b, 210c, 210d, 210e) may be coupled to a region that includes one or more components. The connectors (e.g., 210, 210a, 210b, 210c, 210d, 210e) may be directly coupled to one or more components, or may be coupled to one or more components through an adhesive. The adhesive may be a double-sided adhesive. The adhesive may include a thermally conductive adhesive. The adhesive may have a thermal conductivity value of approximately 2 W/(mk) or higher. However, the adhesive may have a thermal conductivity value that is lower than 2 W/(mk).

It is noted that the implementation of the connectors is not limited to electronic devices that include a display and a keyboard. The connectors may be implemented in any devices that include at least two regions and/or at least two portions. For example, the connectors may be implemented in a mobile device that includes a foldable or bendable display, where the bendable display is located in two portions of the mobile device. The use of at least one uni-directional thermally conductive connector (e.g., 210) may reduce and minimize the amount of heat that is dissipated into the first device portion 202. Thus, more heat is distributed and dissipated into the second device portion 204. This has the effect of increasing the temperature of the second device portion 204. However, since more heat is being dissipated in the second device portion 204, the temperature of the first device portion 202 does not increase as much, thus ensuring a more comfortable experience for a user of the electronic device 200 because the first device portion 202 (which includes a keyboard) is a portion of the electronic device that a user is more likely to use and touch. Examples of heat distribution maps and temperature performances for an electronic device are further illustrated and described in FIGS. 9-12.

FIG. 5 illustrates that the connector 210c includes a conducting portion (e.g., third conducting portion 216c) that may be optionally twisted and/or braided in a rope like fashion. It is noted that any of the connectors (e.g., 210a, 210b, 210d, 210e) described in the disclosure may include a conducting portion (e.g., 216) that is twisted and/or braided in a rope like fashion. Different implementations may twist or braid a conducting portion in different manners. Twisting and/or braiding a conducting portion may make a connector more compact, stronger and more resilient.

Figures 6, 7:
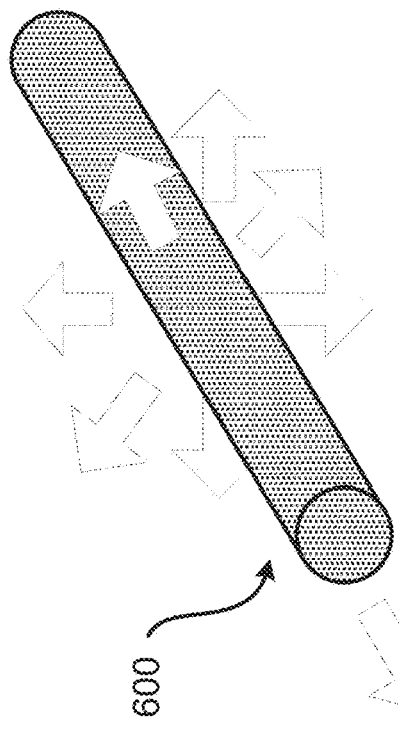
FIG. 6 illustrates a view of a material that has multi-directional thermal conductivity.
FIG. 7 illustrates a view of a material that has uni-directional thermal conductivity.

FIG. 6 illustrates a thermally conductive material 600 that is configured to conduct heat in multiple direction. The thermally conductive material 600 may conduct heat in an axial direction and one or more radial direction. The thermally conductive material 600 may be a multi-directional thermally conductive material 600. Examples of materials that conduct heat in multiple directions include a metal such as copper. To prevent the material 600 from conduct heat in a radial direction, an insulator would need to be provided radially around the material. However, adding an insulator can increase the overall thickness of the conductor.

FIG. 7 illustrates a thermally conductive material 700 that is configured to conduct heat primarily along one direction. In this example, the material 700 is a uni-directional thermally conductive material that is configured to conduct heat in an axial direction (e.g., along the length of the material). In the radial direction, along the width, and/or along the height of the material 700, the material 700 does not conduct heat or conducts very little heat. Thus, in the radial direction, along the width and/or along the height of the material 700, the material 700 may be configured as an insulator (e.g., behaves like an insulator). This means that a separate insulator is not needed radially around the material 700 to prevent heat from dissipating in the radial direction. The material 700 may include an anisotropic thermally conductive material that has a high thermal conductivity value in the first direction (e.g., axial direction, along length), and a low thermal conductivity value in at least a second direction (e.g., radially, along width, along height). In some implementations, a material may be considered a uni-directional thermally conductive material, when the material includes a high thermal conductivity value in the first direction (e.g., axial direction, along length), and a low thermal conductivity value in at least a second direction (e.g., radially, along width, along height). In some implementations, a material may be considered a uni-directional thermally conductive material when at least 90% of the heat is dissipated in one direction of the material and/or one plane (e.g., X-Y plane) of the material. For example, a uni-directional thermally conductive material may be a material where at least 90% of the heat that is dissipated through conduction by the thermally conductive material is dissipated along the first direction and/or first plane of the thermally conductive material. Different implementations may use different percentages to define the meaning of a uni-directional thermally conductive material. In some implementations, a material may be considered a uni-directional thermally conductive material when the material has a thermal conductivity value along one direction (e.g., axial direction) that is at least 10 times greater than the thermal conductivity value along another direction (e.g., radial direction).

Figure 8:
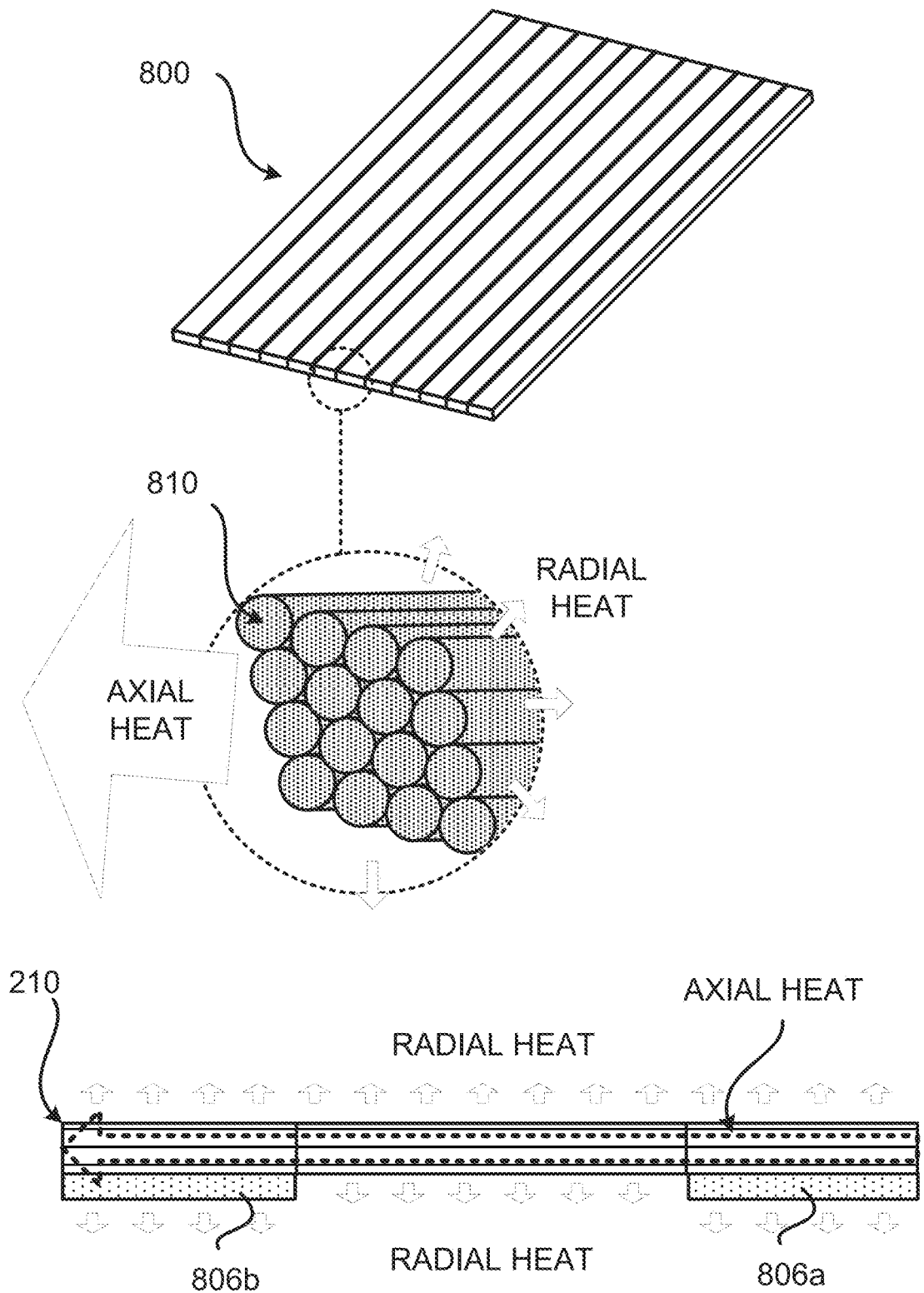
FIG. 8 illustrates a view of a material that has uni-directional thermal conductivity.

FIG. 8 illustrates a thermally conductive material 800 that is configured to conduct heat primarily along one direction. The material 800 includes a plurality of carbon fibers that are aligned and/or oriented in a particular direction. Some of the carbon fibers may be aligned along laterally (e.g., along length, along width, horizontally). Some of the carbon fibers may be aligned in different directions (e.g., vertically, diagonally), or combinations thereof. A majority of the carbon fibers may be aligned in approximately the same direction. The material 800 may include pitch-based carbon fibers. The material 800 may be a composite material. For examples, the material 800 may include a plurality of carbon fibers and resin. The thermally conductive material 800 may include an anisotropic thermal conductivity value, where the material 800 may be a thermally conductive material that has a high thermal conductivity value in the first direction (e.g., axial direction, along length), and a low thermal conductivity value in at least a second direction (e.g., radially, along width, along height). The thermally conductive material 800 may have a thermal conductivity value in a first direction (e.g., axial direction) that is in a range of approximately 200-800 Watts per meter kelvin (W/(mk)). The thermally conductive material 800 may have a thermal conductivity value in a second direction (e.g., radial direction) that is approximately 30 W/(mk). The resin may have a thermal conductivity value of approximately 0.2 W/(mk). The thermally conductive material 800 may have a thermal conductivity value in a second direction (e.g., radial direction) of approximately 30 W/(mk) may be an average of the thermal conductivity value of the carbon fiber and the thermal conductivity value of the resin.

In some implementations, the thermally conductive material 800 may include graphite (e.g., graphite sheet). Graphite is another example of a material that includes an anisotropic thermal conductivity value. The graphite sheet may have a thermal conductivity value in a X-Y plane (X-axis/direction, Y axis/direction) in a range of approximately 1100-1900 W/(mk), and a thermal conductivity value in a Z axis/direction in a range of approximately 15-21 W/(m/k).

FIG. 8 further illustrates how heat dissipation may occur for the uni-directional thermally conductive connector 210 that includes a material that has anisotropic thermal conductivity values and/or properties. FIG. 8 illustrates that the connector 210 has high thermal conductivity in the axial direction, but little thermal conductivity in the radial direction. The connector 210 may be coupled to adhesives 806a-806b. The adhesives 806a-806b may be a double-sided tape. The adhesives 806a-806b may help the connector 210 coupled to different components of an electronic devices.

FIGS. 9 and 10 illustrate heat maps for an electronic device without a thermally conducive connector and an electronic device with a uni-directional thermally conductive connector. As shown in FIG. 9, the electronic device without a thermally conductive connector reaches high temperatures (e.g., hot region) in several parts of the keyboard portion and the back side of the keyboard portion. The keyboard portion is a region that the use touches during an operation of the electronic device, and the back side of the keyboard portion may be a portion that is resting on top of a user (e.g., legs of user). FIG. 9 illustrates that the region the electronic device is hottest is also the region a user is most likely to touch.

FIG. 10 illustrates that the electronic device with a uni-directional thermally conductive connector results in lower temperatures in the keyboard portion, since more heat has been dissipated into the display portion of the electronic device. Although the display portion is hotter, the user of the electronic device is not likely to touch it as much as the keyboard portion. FIG. 10 illustrates that an electronic device with a uni-directional thermally conductive connector provides an electronic device that is more comfortable (temperature wise) than an electronic device without the uni-directional thermally conductive connector.

Figure 11:
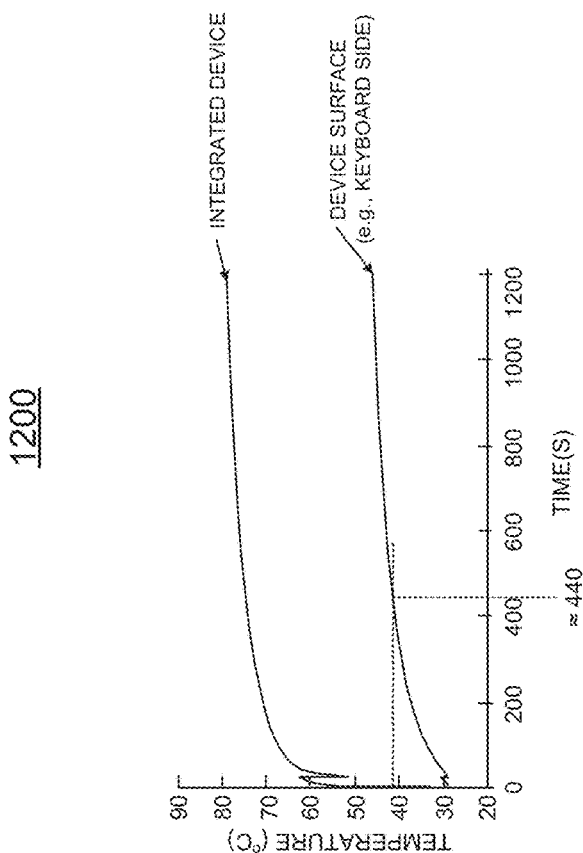
FIG. 11 illustrates an exemplary temperature profile for a computer device without a heat dissipating cable.
Figure 12:
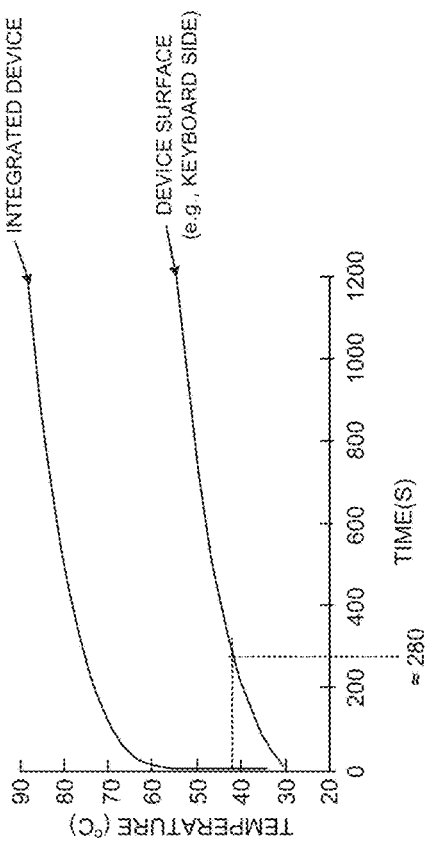
FIG. 12 illustrates an exemplary temperature profile for a computer device that includes a uni-directional thermally conductive connector.

FIGS. 11 and 12 illustrate graphs that show heat dissipating and temperature performances of a device that does not use a thermally conducive connector and a device that uses a uni-directional thermally conductive connector. The graph 1100 illustrates a temperature profile (e.g., junction temperature profile) of an integrated device and a top surface temperature profile (e.g., a keyboard surface temperature profile) of the device, when no thermally conductive connector is implemented with a device. The graph 1200 illustrates a temperature profile (e.g., junction temperature profile) of an integrated device (e.g., integrated device 270, 407, 408) and top surface temperature profile (e.g., a keyboard surface temperature profile) of the device, when a uni-directional thermally conductive connector (e.g., 210) is implemented with the device (e.g., 200).

The graph 1100 illustrates that within about 500 seconds, the junction temperature of the integrated device has risen to about 80 degree Celsius. In contrast, as shown in graph 1200, when a uni-directional thermally conductive connector is implemented, the junction temperature of the integrated device has risen to less than 75 degree Celsius. The graph 1100 illustrates that within about 280 seconds, the top surface temperature (e.g., keyboard surface temperature) has reached 42 degree Celsius (which is the normal skin temperature of a human). In contrast, as shown in graph 1200, when a uni-directional thermally conductive connector is implemented, the top surface temperature (e.g., keyboard surface temperature) does not reach 42 degree Celsius until at least about 440 seconds. With the uni-directional thermally conductive connector, the integrated device may not need to be throttled until 440 seconds. At around 1200 seconds, the temperature of the integrated device in a device without the thermally conductive connector, reaches about 88 degree Celsius. In contrast, at around 1200 seconds, the temperature of the integrated device that includes a uni-directional thermally conductive connector, reaches about 79 degree Celsius, a 9-degree Celsius improvement. In addition, the integrated device may be able to operate at "full speed" for a longer period of time, before throttling of the integrated device is necessary. For example, if the integrated device is configured to perform signal processing (e.g., signal processing at 5G speeds), the integrated device may operate for longer periods of time (e.g., may process signals at 5G speeds for longer periods of time, which means more data transfer (throughput) capabilities), before having to throttle the speed down, when a uni-directional thermally conductive connector is implemented in an electronic device.

FIG. 12 illustrates that the use of a uni-directional thermally conductive connector (e.g., 210) provides better heat dissipation of integrated devices (e.g., 202), while also reducing the rate at which the surface temperatures of a devices increases, thereby making the device more comfortable for a user of the device.

It is noted that the illustrations of FIGS. 9-12 are merely exemplary. Different implementations may provide different results and performances in the heat map and temperature profiles.

Figure 13:
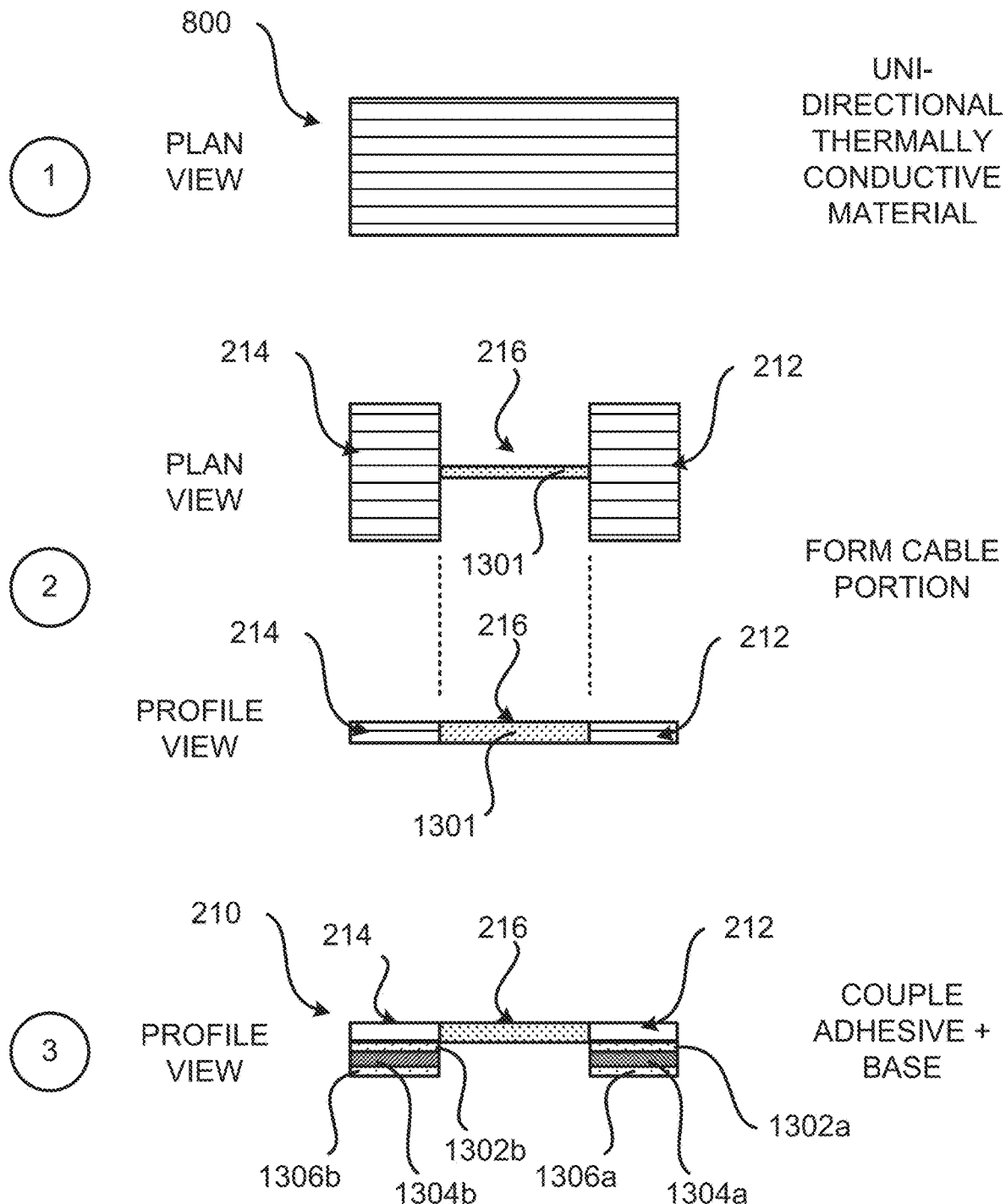
FIG. 13 illustrates an exemplary sequence for fabricating a uni-directional thermally conductive connector.

Exemplary Sequence for Fabricating a Package a Uni-Directional Thermally Conductive Connector FIG. 13 illustrates an exemplary sequence for providing or fabricating a uni-directional thermally conductive connector. In some implementations, the sequence of FIG. 13 may be used to provide or fabricate the uni-directional thermally conductive connector 210 described in the disclosure.

It should be noted that the sequence of FIG. 13 may combine one or more stages in order to simplify and/or clarify the sequence for providing or fabricating a connector. In some implementations, the order of the processes may be changed or modified. In some implementations, one or more of processes may be replaced or substituted without departing from the spirit of the disclosure.

Stage 1, as shown in FIG. 13, illustrates a state after a uni-directional thermally conductive material 800 is provided. The thermally conductive material 800 may configured to conduct heat primarily along one direction. The material 800 may be a composite material. The material 800 includes a plurality of carbon fibers that are aligned and/or oriented in a particular direction. The material 800 may include pitch-based carbon fiber. The material 800 may be a thermally conductive material that has a high thermal conductivity value in the first direction (e.g., axial direction, along length), and a low thermal conductivity value in at least a second direction (e.g., radially, along width, along height). The thermally conductive material 800 may have a thermal conductivity value in a first direction (e.g., axial direction) that is in a range of approximately 200-1900 Watts per meter kelvin (W/(mk)). The material 800 may be cut to a particular shape and/or size depending on what is needed.

Stage 2 illustrates a state after portions of the material 800 is at least partially surrounded and/or wrapped to form the third conducting portion 216. The third conducting portion 216 may be folded, compressed and/or bent. The third conducting portion 216 may be twisted and/or braided in a rope like fashion. A tape 1301 may be used to surround and/or wrap portions of the material 800. However, different implementations may use different materials to surround and/or wrap the third conducting portion 216. The third conducting portion 216 may be a flexible cable (e.g., flexible cable portion). Surrounding, wrapping, twisting, and/or braiding the third conducting portion 216 may define the first conducting portion 212 and the second conducting portion 214. The first conducting portion 212, the third conducting portion 216 and the second conducting portion 214 may be contiguous portions of a uni-directional thermally conductive connector 210.

Stage 3 illustrates a state after several components and/or material are coupled to the connector 210. An adhesive 1302a is coupled to the first conducting portion 212. A base 1304a is coupled to the adhesive 1302a. The base 1304a may include a hard plastic and/or a metal. An adhesive 1306a is coupled to the base 1304a. An adhesive 1302b is coupled to the second conducting portion 214. A base 1304b is coupled to the adhesive 1302b. The base 1304b may include a hard plastic and/or a metal. An adhesive 1306b is coupled to the base 1304b. The above components may be considered part of the connector 210. The bases 1304a-1304b and the adhesives 1306a-1306b may be optional. In some implementations, the connector 210 may be coupled to components of an electronic devices through the adhesives 1302a-1302b and/or the adhesives 1306a-1306b.

Figure 14:
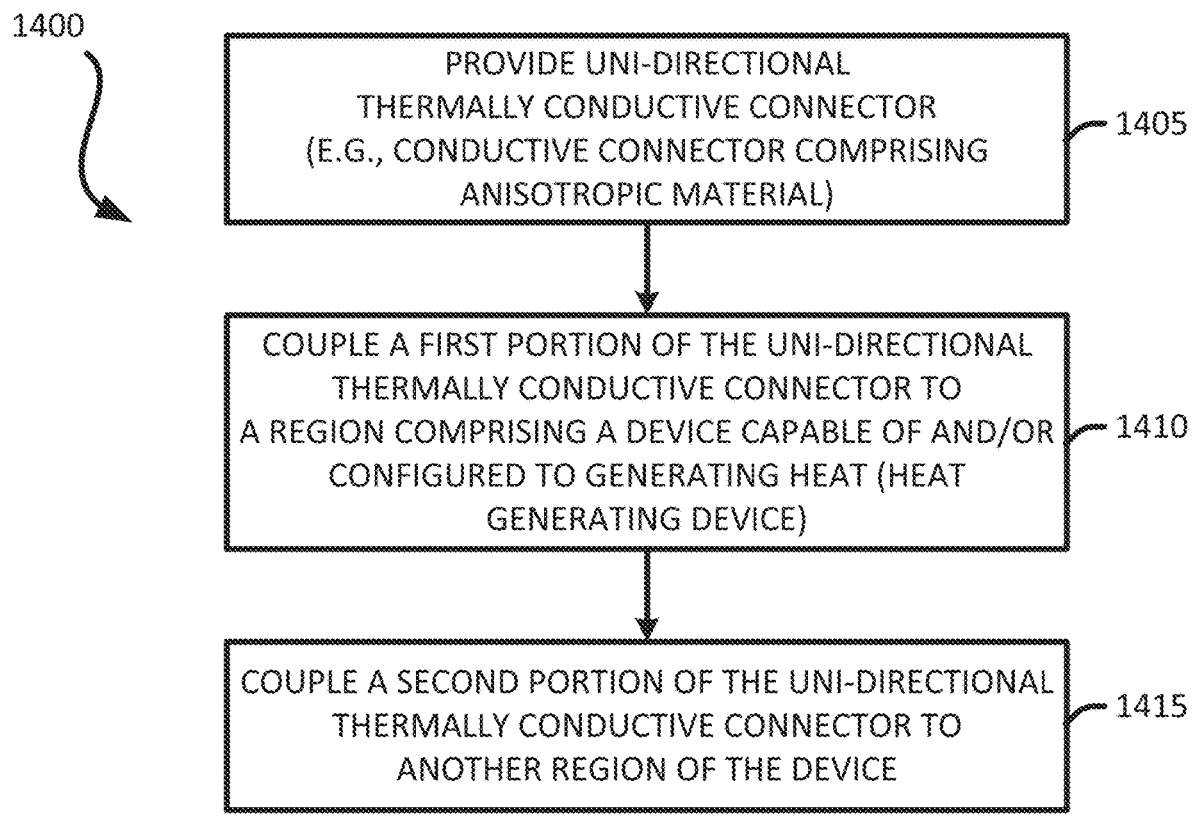
FIG. 14 illustrates an exemplary flow diagram of a method for providing a computer device with a uni-directional thermally conductive connector.

Exemplary Flow Diagram of a Method for Coupling a Uni-Directional Thermally Conductive Connector to an Electronic Device In some implementations, fabricating a package with an encapsulation layer with controlled undercut includes several processes. FIG. 14 illustrates an exemplary flow diagram of a method 1400 for coupling a uni-directional thermally conductive connector to an electronic device. In some implementations, the method 1400 of FIG. 14 may be used to couple the connector 210 to an electronic device 200. However, the method 1400 may be used to couple a connector to any device described in the disclosure.

It should be noted that the sequence of FIG. 14 may combine one or more processes in order to simplify and/or clarify the method for coupling a connector to any device. In some implementations, the order of the processes may be changed or modified.

The method provides (at 1405) an uni-directional thermally conductive connector (e.g., 210). FIG. 13 illustrates an example of fabricating a uni-directional thermally conductive connector. The unit-directional thermally conductive connector may include a thermally conductive material (e.g., 800) that may be configured to conduct heat primarily along one direction. The material 800 may be a composite material. The material 800 includes a plurality of carbon fibers that are aligned and/or oriented in a particular direction. The material 800 may include pitch-based carbon fiber. The material 800 may be a thermally conductive material that has a high thermal conductivity value in the first direction (e.g., axial direction, along length), and a low thermal conductivity value in at least a second direction (e.g., radially, along width, along height). The thermally conductive material 800 may have a thermal conductivity value in a first direction (e.g., axial direction) that is in a range of approximately 200-1900 Watts per meter kelvin (W/(mk)). The connector may include a first conducting portion (e.g., 212), a second conducting portion (e.g., 214) and a third conducting portion (e.g., 216).

The method couples (at 1410) a first conducting portion (e.g., 212) of the uni-directional thermally conductive connector, to a region that includes at least one component configured to generate heat (e.g., heat generating component). For example, the method may couple the first conducting portion to a region of the first device portion (e.g., 202) of the electronic device 200. A component may include an integrated device, a radio frequency (RF) device, a passive device, a filter, a surface acoustic wave (SAW) filters, a bulk acoustic wave (BAW) filter, a processor, a memory, and/or combinations thereof. An adhesive may be used to couple the first conducting portion to a region and/or a component. The first conducting portion may be coupled to a component of the first device portion 202 of the electronic device 200. FIGS. 4 and 5 illustrate examples of where the first conducting portion may be coupled.

The method couples (at 1415) a second conducting portion (e.g., 214) of the uni-directional thermally conductive connector, to another region of the electronic device. For example, the method may couple the second conducting portion to a region of the second device portion (e.g., 204) of the electronic device 200. In another example, the method may couple the second conducting portion to another region of the first device portion (e.g., 202) of the electronic device 200. An adhesive may be used to couple the second conducting portion to a region and/or a component. The second conducting portion may be coupled to a component of the first device portion 202 or the second device portion 204. FIGS. 4 and 5 illustrate examples of where the second conducting portion may be coupled.

Exemplary Electronic Devices

Figure 15:
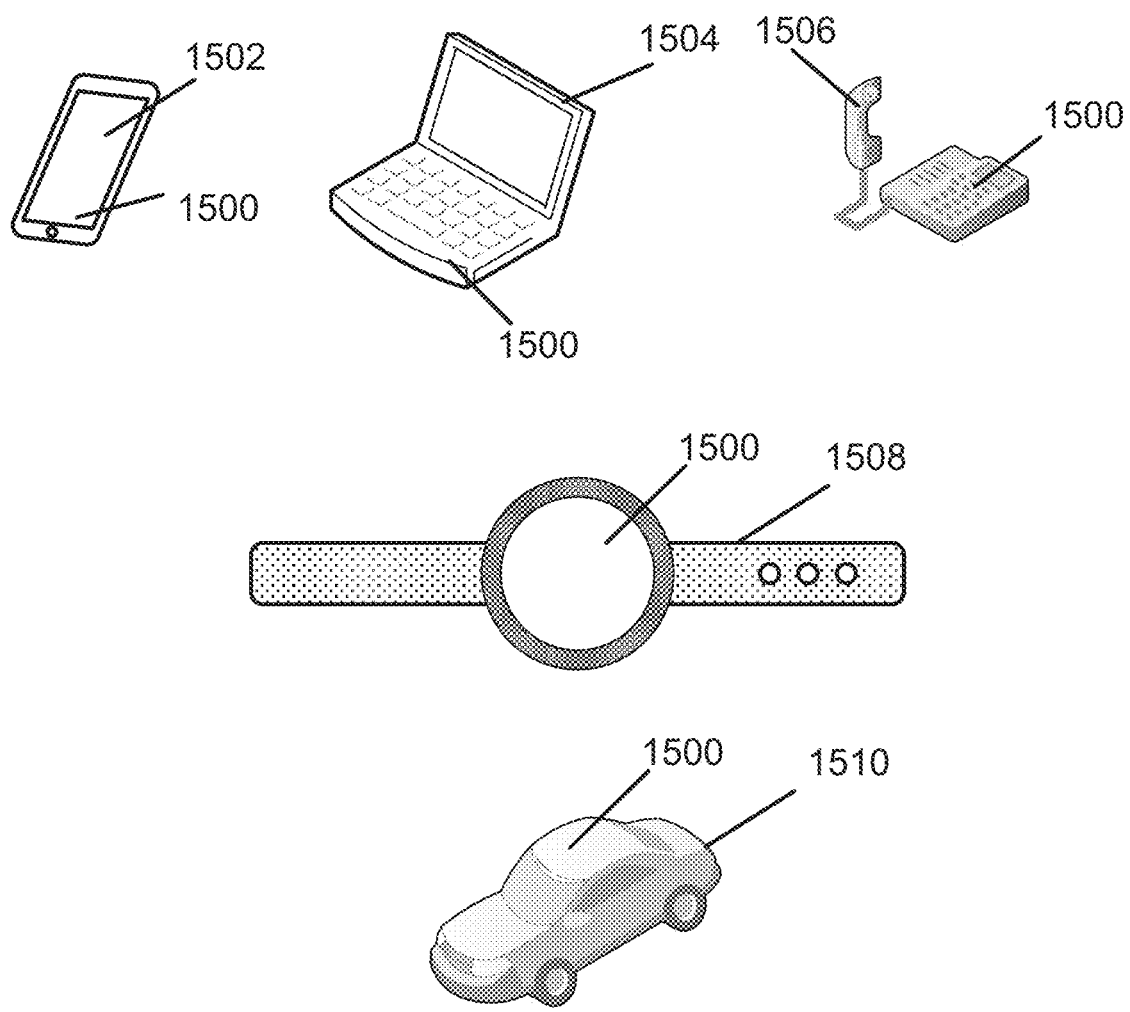
FIG. 15 illustrates various electronic devices that may integrate a die, an integrated device, an integrated passive device (IPD), a passive component, a package, and/or a device package described herein.

FIG. 15 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or integrated circuit (IC) packages described herein. The devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-8 and/or 13-15 may be rearranged and/or combined into a single component, process, feature or function or embodied in several components, processes, or functions. Additional elements, components, processes, and/or functions may also be added without departing from the disclosure. It should also be noted FIGS. 2-8 and/or 13-15 and its corresponding description in the present disclosure is not limited to dies and/or ICs. In some implementations, FIGS. 2-8 and/or 13-15 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. Electromagnetic coupling may mean that a signal from one circuit and/or component affects a signal of another circuit and/or component. Electromagnetic coupling may cause crosstalk. Electromagnetic coupling may be a form of signal coupling. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "encapsulating" means that the object may partially encapsulate or completely encapsulate another object. The term "surrounding" means that an object(s) may partially surround or completely surround another object. The term "extends through" means that the object may partially extend or completely extend through another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect may include an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
   a first device portion comprising a region that includes a printed circuit board and a component configured to generate heat, wherein the component is coupled to the printed circuit board;
   a second device portion coupled to the first device portion, wherein the second device portion includes a display; and
   means for uni-directional thermal conduction coupled to (i) the component through an adhesive and (ii) the second device portion,
   wherein the adhesive touches the means for uni-directional thermal conduction and the component,
   wherein the means for uni-directional thermal conduction includes a flexible cable portion that is twisted and/or braided in a rope like fashion, and
   wherein the means for uni-directional thermal conduction includes a plurality of carbon fibers.

2. The apparatus of claim 1,
   wherein the means for uni-directional thermal conduction includes a thermally conductive material that dissipates heat through conduction along a first direction of the thermally conductive material, and
   wherein at least 90% of the heat that is dissipated through conduction by the thermally conductive material is dissipated along the first direction of the thermally conductive material.

3. The apparatus of claim 2, wherein the thermally conductive material includes a thermal conductivity value in an axial direction that is in a range of approximately 200-1900 Watts per meter kelvin (W/(mk)).

4. The apparatus of claim 2, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

5. The apparatus of claim 1, wherein the means for uni-directional thermal conduction is configured to dissipate heat away from the first device portion and towards the second device portion.

6. The apparatus of claim 1, wherein the means for uni-directional thermal conduction includes a thermally conductive material that primarily dissipates heat along a first direction of the thermally conductive material.

7. The apparatus of claim 6,
   wherein the thermally conductive material includes an anisotropic thermally conductive material,
   wherein the thermally conductive material has a high thermal conductivity value in the first direction, and
   wherein the thermally conductive material has a low thermal conductivity value in at least a second direction.

8. The apparatus of claim 7,
wherein the first direction is an axial direction of the thermally conductive material, and
wherein the second direction includes a radial direction of the thermally conductive material.

9. The apparatus of claim 1, wherein the first device portion and the second device portion are coupled together through at least one hinge.

10. An electronic device comprising:
a first device portion comprising a region that includes a printed circuit board and a component configured to generate heat, wherein the component is coupled to the printed circuit board;
a second device portion coupled to the first device portion, wherein the second device portion includes a display; and
a thermally conductive connector coupled to (i) the printed circuit board in the first device portion and (ii) the second device portion,
wherein the thermally conductive connector includes an anisotropic thermally conductive material,
wherein the thermally conductive connector is coupled to the printed circuit board through an adhesive such that the adhesive touches the thermally conductive connector and the printed circuit board,
wherein the thermally conductive connector includes a flexible cable portion that is twisted and/or braided, and
wherein the thermally conductive connector includes a plurality of carbon fibers and a resin.

11. The electronic device of claim 10, wherein the anisotropic thermally conductive material is configured to primarily dissipate heat along a first axial direction of the anisotropic thermally conductive material.

12. The electronic device of claim 10, wherein the anisotropic thermally conductive material is configured to primarily dissipate heat along a first plane of the anisotropic thermally conductive material.

13. The electronic device of claim 10
wherein the thermally conductive material has a high thermal conductivity value in the first direction, and
wherein the thermally conductive material has a low thermal conductivity value in at least a second direction.

14. The electronic device of claim 10, wherein the first device portion and the second device portion are coupled together through at least one hinge.

* * * * *